US011375626B2

(12) United States Patent
Burrell et al.

(10) Patent No.: US 11,375,626 B2
(45) Date of Patent: Jun. 28, 2022

(54) MULTI-FUNCTIONAL FRONT SLICE PANEL APPARATUS AND METHOD OF MANUFACTURE

(71) Applicant: Raytheon Company, Waltham, MA (US)

(72) Inventors: Keith R. Burrell, Waltham, MA (US); Andrew J. Bristol, Waltham, MA (US); Kashif V. Laurie, Waltham, MA (US)

(73) Assignee: Raytheon Company, Waltham, MA (US)

( * ) Notice: Subject to any disclaimer, the term of this patent is extended or adjusted under 35 U.S.C. 154(b) by 165 days.

(21) Appl. No.: 16/859,521

(22) Filed: Apr. 27, 2020

(65) Prior Publication Data

US 2021/0337678 A1    Oct. 28, 2021

(51) Int. Cl.
| | |
|---|---|
| *H05K 5/00* | (2006.01) |
| *H05K 7/14* | (2006.01) |
| *H05K 5/02* | (2006.01) |
| *H05K 9/00* | (2006.01) |

(52) U.S. Cl.
CPC ......... *H05K 5/0026* (2013.01); *H05K 5/0269* (2013.01); *H05K 5/0286* (2013.01); *H05K 7/1402* (2013.01); *H05K 7/1438* (2013.01); *H05K 9/0003* (2013.01); *H05K 9/0015* (2013.01)

(58) Field of Classification Search
CPC ........................... H05K 7/1407; H05K 9/0015
See application file for complete search history.

(56) References Cited

U.S. PATENT DOCUMENTS

| | | | |
|---|---|---|---|
| 5,229,925 A | 7/1993 | Spencer et al. | |
| 5,506,373 A | 4/1996 | Hoffman | |
| 6,023,415 A | 2/2000 | Mayer | |
| 6,870,093 B2 | 3/2005 | King et al. | |
| 7,214,888 B1 | 5/2007 | Feroli et al. | |
| 2005/0061526 A1 | 3/2005 | Hensley | |
| 2007/0109755 A1 | 5/2007 | Mueller | |
| 2009/0219702 A1* | 9/2009 | Mazura | H05K 7/1407 361/740 |

(Continued)

OTHER PUBLICATIONS

International Search Report and Written Opinion from related PCT Application No. PCT/US2020/051950, dated Jan. 12, 2021.

*Primary Examiner* — Hung V Ngo
(74) *Attorney, Agent, or Firm* — Burns & Levinson LLP; Joseph M. Maraia (57) ABSTRACT

A circuit card assembly including a printed circuit board arranged to include one or more electronic circuits and a frame connected to the printed circuit board. The circuit card including at least one connector arranged to detachably engage with a backplane connector of the electronic chassis to establish an electrical connection with a backplane printed wiring board (PWB) of the electronic chassis. The circuit card also including a front panel having at least one input/output connector and an EMI/RFI gasket positioned along a perimeter of the back side of the front panel where the EMI/RFI gasket is arranged to contact a surface of the electronic chassis along a perimeter of the circuit card assembly slot when the circuit card assembly is extended into the circuit card assembly slot.

20 Claims, 8 Drawing Sheets

(56) References Cited

U.S. PATENT DOCUMENTS

| | | | |
|---|---|---|---|
| 2011/0151685 A1* | 6/2011 | Hamner | H05K 7/1407 |
| | | | 439/65 |
| 2013/0293239 A1* | 11/2013 | Holma | H05K 7/1438 |
| | | | 324/508 |
| 2019/0254189 A1* | 8/2019 | Yu | G06F 1/185 |

* cited by examiner

MULTI-FUNCTIONAL FRONT SLICE PANEL APPARATUS AND METHOD OF MANUFACTURE

TECHNICAL FIELD

This application relates generally to enclosures for electronic equipment and, more particularly, to enclosures for electronic equipment that may be subject to various environment stresses.

BACKGROUND

Aerospace and airborne vehicles, among other types of vehicles, house electronic systems that can perform various operations such as providing navigational control, power, communications, payload monitoring, and data collection. These vehicles, and their electronic systems, are often subjected to extreme environmental stresses. Vehicles operating in air and space can experience substantial physical stresses, including extreme vibrations and shocks, or enhanced electromagnetic interference and radio frequency interference (EMI/RFI). Certain existing aerospace and airborne systems utilize enclosures for their electronic components that are configured to be resistant to environmental stresses in air and space. Some of these enclosures include EMI/RFI shielding.

To provide structural strength and durability, external interconnections are typically positioned on a backplane printed wiring board (PWB) or printed circuit board (PCB) assembly of an electronic equipment chassis or enclosure, requiring increased complexity in the design of the backplane PWB and more complex test equipment or procedures for testing sliding cards. Such added complexity often delays system development and implementations. Also, depending on the size or form-factor of a connector sliding card, only a limited quantity of external connectors may be supported. Furthermore, to provide EMI/RFI shielding in existing systems, a separate EMI/RFI shield is typically attached to the front of a chassis, which prevents external interconnects from being positioned on the front panel of a sliding circuit card.

SUMMARY

The application, in various implementations, addresses deficiencies associated with electronic circuit enclosures and/or chassis that are subject to various environmental stresses.

This application describes an exemplary multi-functional slice front panel, a circuit card assembly, and/or an electronic chassis arranged to enable more efficient operation and maintenance of electronic systems housed within an electronic equipment enclosure. For example, by allowing an electronic chassis to receive one or more multi-functional card assemblies having multiple types of external interface connectors, an operator is able to efficiently remove a single circuit card assembly with a front panel, while leaving other circuit card assemblies in place. In one instance, a circuit card assembly may be removed and replaced with the same type of circuit card assembly to possibly repair the originally-defective circuit card and its electronic circuits. In another instance, a circuit card assembly may be replaced with a circuit card assembly with a multi-functional slice front panel having a different set of external interface connectors.

Hence, the modular feature of having an electronic chassis capable of receiving multiple circuit card assemblies, where each card includes a front panel having various reconfigurable external connector configurations enables a realization of an inventive multi-functional front slice panel for an electronic chassis. In other words, the various front panels of the various circuit card assemblies form an overall front slice panel when their respective circuit card assemblies are fully inserted into an electronic chassis such that the front panel slices associated with the various circuit card assemblies and the overall front panel are removable and/or interchangeable. Such a system is more adaptable, configurable, and maintainable than conventional electronic equipment enclosures.

Some of the inventive aspects of the multi-functional front slice panel configuration are implemented based on a realization that, instead of using a EMI/RFI shield plate to cover one or all of the circuit card assemblies after installation in an electronic chassis, each circuit card assembly is assembled before installation with a front panel including an EMI/RFI shield and EMI/RFI gasket configured to contact a chassis along a periphery of a circuit card assembly slot of the electronic chassis. In this way, each circuit card assembly and its front panel individually form an EMI/RFI shield when each circuit card assembly is fully engaged within a slot of the electronic chassis. This allows for individual replacement and/or upgrade of the electronics and/or connectors of an individual circuit card while not affecting operations or requiring reconfigurations of other circuit cards or the electronic chassis.

An electronic enclosure and/or chassis that holds one or more circuit card assemblies with front panels may advantageously receive circuit card assemblies of different form-factors or sizes, allowing for further adaptability of an electronic equipment housing. The multi-functional front slice panel configuration also eliminates the need for positioning external connectors adjacent to the electronic chassis housing the circuit card assemblies. This advantageously reduces the complexity of the electronic enclosure and chassis backplane and also reduces potential loading on sliding circuit card assemblies, an enclosure, and connectors. By eliminating the need for a separate external connector section positioned adjacent to the electronic chassis housing circuit card assemblies, the electronic chassis and/or enclosure described herein advantageously provides a structure that is more resistant to environmental conditions or stresses such as vibrations and shocks.

In one aspect, a circuit card assembly includes a printed circuit board arranged to include one or more electronic circuits. The circuit card assembly includes a frame connected to the printed circuit board. The frame includes first and second sides positioned adjacent to first and second sides of the printed circuit board. The first and second sides of the frame are arranged to extend into and retract out of first and second channels of a circuit card assembly slot of an electronic chassis. The circuit card assembly also includes at least one connector arranged to detachably engage with a backplane connector of the electronic chassis when the circuit card assembly is extended into the circuit card assembly slot of the electronic chassis where the connector establishes an electrical connection with a backplane printed wiring board (PWB) of the electronic chassis while engaged with the backplane connector.

The circuit card assembly further includes a front panel extending from the first side to the second side of the frame. The front panel includes a front side facing away from the printed circuit board and a back side facing toward the printed circuit board. The front panel includes at least one input/output connector extending from the front side of the front panel. The at least one input/output connector is in electrical communication with the one or more electronic circuits. The front panel also includes an EMI/RFI gasket positioned along a perimeter of the back side of the front panel. The EMI/RFI gasket is arranged to contact a surface of the electronic chassis along a perimeter of the circuit card assembly slot when the circuit card assembly is extended into the circuit card assembly slot.

In some implementations, the front panel is permanently or semi-permanently connected to the frame and/or printed circuit board. The front panel may be connected to the frame and/or the printed circuit board before being extended into the circuit card assembly slot. The front panel may be integrated or integrally formed with the frame. In some configurations, the front panel includes a plurality of input/output connectors. The plurality of input/output connectors may include at least two different types of connectors. The type of connector may include: a radio frequency (Rf) connector, D-sub or D-shaped connector, fiber optic connector, Amphenol connector, Thermocouple connector, coaxial connector, barrel audio or power connector, pluggable connector, USB connector, DVI connector, HDMI connector, modular connector, LGH connector, photovoltaic connector, and/or rectangular connector.

In certain implementations, the front panel includes an EMI/RFI shield. The EMI/RFI shield may include electrically conductive material. The front panel may include multiple EMI/RFI gaskets. The front panel may include and/or provide an ionizing radiation shield. In some configurations, the frame is configured to provide structural support to the printed circuit board. The circuit card assembly may include at least one fastener that is accessible via the front panel and arranged to fasten the circuit card assembly to the electronic chassis. At least one fastener may include a wedge lock fastener and/or threaded fastener.

In another aspect, an electronic enclosure includes a chassis having a plurality of circuit card assembly slots including a first circuit card assembly slot arranged to receive a first circuit card assembly. The first circuit card assembly slot includes a peripheral surface arranged to contact an EMI/RFI gasket of the first circuit card assembly when the circuit card assembly is extended into the first circuit card assembly slot. The first circuit card assembly slot is configured to receive a circuit card assembly having: i) a printed circuit board arranged to include one or more electronic circuits, ii) a frame connected to the printed circuit board, iii) at least one connector in electrical communication with the one or more electronic circuits, and iv) a front panel including a front side facing away from the printed circuit board and a back side facing toward the printed circuit board. The front panel also includes at least one input/output connector extending from the front side of the front panel and an EMI/RFI gasket positioned along a perimeter of the back side of the front panel.

The electronic enclosure also includes a backplane printed wiring board that is connected to the chassis and has a plurality of backplane connectors aligned with the plurality of circuit card assembly slots. The plurality of backplane connectors include a first backplane connector aligned with the first circuit card assembly slot. The first backplane connector is arranged to detachably engage with the at least one connector of the first circuit card assembly when the first circuit card assembly is extended into the first circuit card assembly slot. The first back plane connector establishes an electrical connection with first circuit card assembly while engaged with the at least one connector of the first circuit card assembly.

In some implementations, the chassis includes an EMI/RFI shield. The electronic enclosure may include a backside cover that is positioned adjacent to the backplane printed wiring board and connected with the chassis. The plurality of circuit card assembly slots may be configured to receive circuit card assemblies having different form factors. The form factors may include a 9U, 6U, and/or 3U form factors.

In a further aspect, a method of manufacturing a circuit card assembly includes: providing a printed circuit board arranged to include one or more electronic circuits; attaching a frame to the printed circuit board where the frame includes first and second sides positioned adjacent to first and second sides of the printed circuit board. The first and second sides of the frame are arranged to extend into and retract out of first and second channels of a circuit card assembly slot of an electronic chassis; attaching at least one connector to the printed circuit board where the at one connector is arranged to detachably engage with a backplane connector of the electronic chassis when the circuit card assembly is extended into the circuit card assembly slot of the electronic chassis. The connector being configured to establish an electrical connection with a backplane printed wiring board (PWB) of the electronic chassis while engaged with the backplane connector; and attaching a front panel to the frame where the front panel includes a front side facing away from the printed circuit board and a back side facing toward the printed circuit board.

Any two or more of the features described in this specification, including in this summary section, may be combined to form implementations not specifically described in this specification. Furthermore, while this specification may refer to examples of systems and methods related to air and space, the implementations and methods herein equally apply to land, sea, and underwater systems. The implementations herein also apply equally to fixed facilities or systems that may be subject to extreme environmental stresses or conditions.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

The application, in various aspects, addresses deficiencies associated with housing electronic equipment in vehicles subjected to environmental stresses, including vehicles operating in air and space. The application includes exemplary apparatuses, systems and methods for enhancing operations, maintenance, scalability, adaptability, and robustness for electronic enclosures in vehicles or fixed structures that are subject to environmental stresses. An air or space vehicle may include, without limitation, a satellite, space probe, spacecraft, landing module, rocket booster, rocket component, aircraft, drone, and unmanned or autonomous aerial vehicle (UAV). A land or sea based vehicle or structure may also utilize an electronic enclosure, electronic chassis, circuit card assembly, and/or multi-functional front slice panel as described herein.

Figure 1:
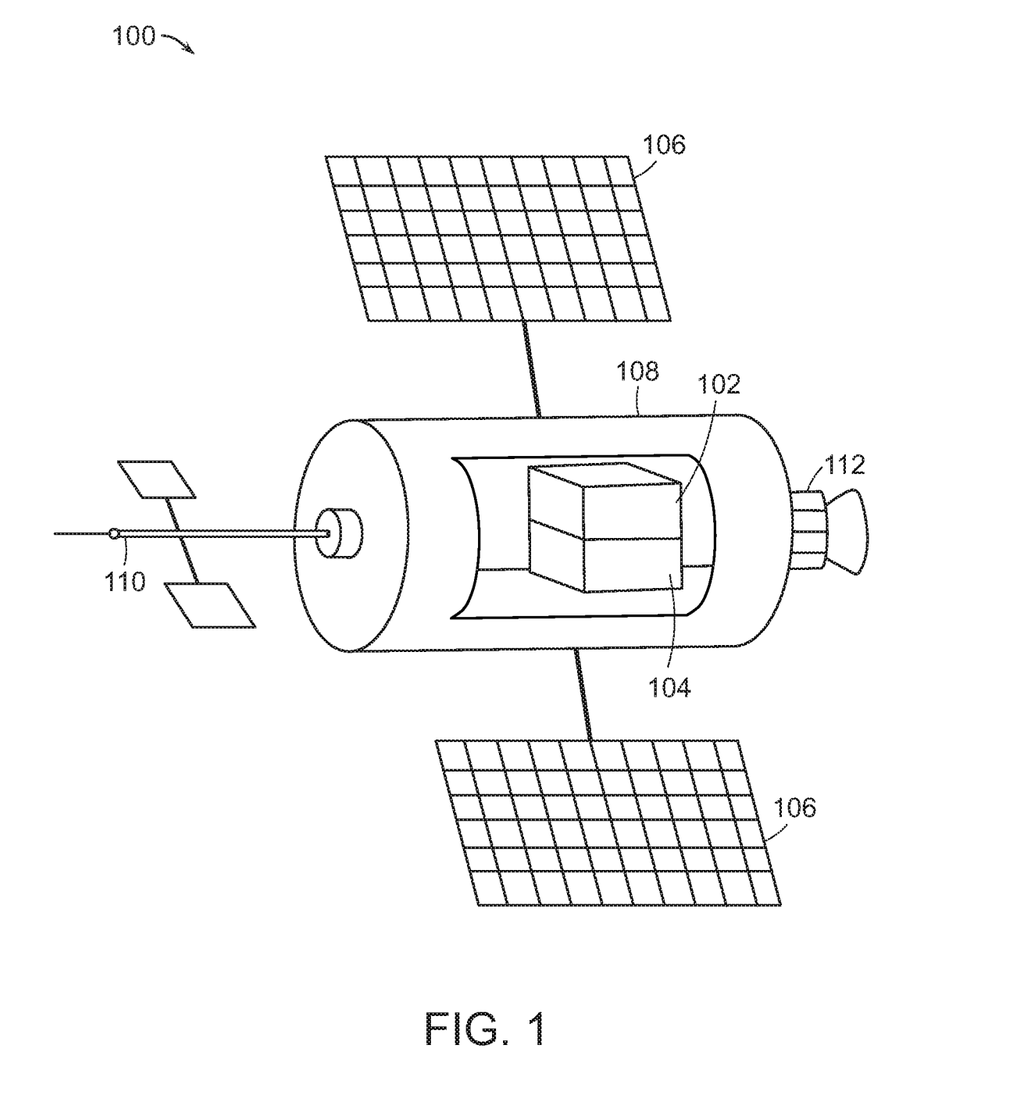
FIG. 1 is a diagram of an exemplary aerospace vehicle including one or more enclosures of electronic equipment.

FIG. 1 is a diagram of an exemplary aerospace vehicle 100 including one or more electronic equipment enclosures 102 and 104 of electronic equipment. In this example, aerospace vehicle 100 is a satellite configured to orbit the Earth. Vehicle 100 is an example of one type of space vehicle utilizing electronic systems and circuits to enable operations, communications, and control of vehicle 100. Vehicle 100 includes a main housing unit 108 in which electronic equipment enclosures 102 and 104 are positioned. Vehicle 100 may include solar panels 106, an antenna 110, and propulsion system 112, among other component not shown that may enable operations of the satellite vehicle 100. Electronic enclosure 102 may house command and control systems and electronics. Enclosure 102 may include a chassis such as described with respect to FIGS. 2 and 3. Electronic enclosure 104 may house communications and data storage systems. Enclosure 104 may include a chassis such as described with respect to FIGS. 2 and 3.

Figure 2:
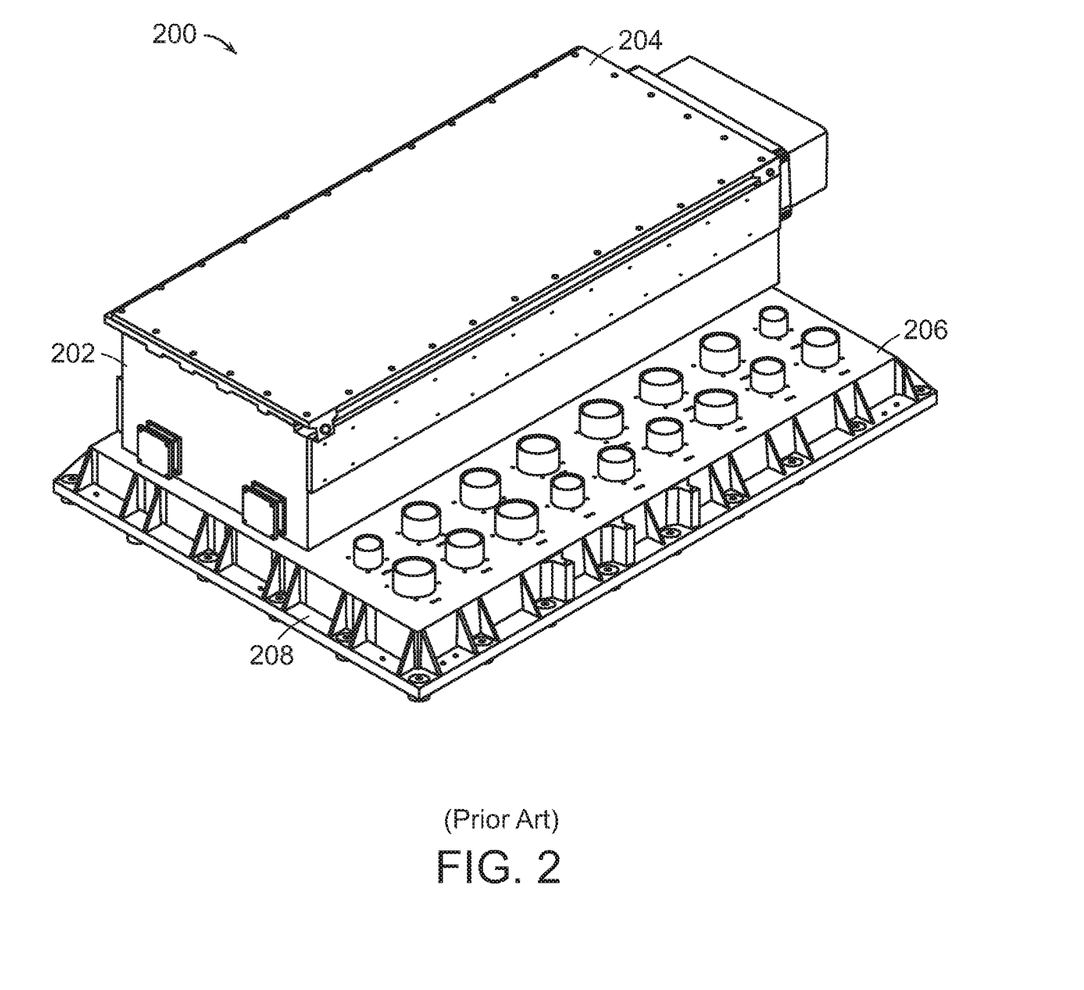
FIG. 2 shows an electronic chassis arranged to house a sliding card with a single unit cover and external interconnects positioned on its backplane PWB assembly.

FIG. 2 shows a heritage or conventional electronic enclosure 200 including a chassis 202 arranged to house 6U VPX sliding cards using a single unit cover 204 and an external interconnect section 206 positioned adjacent to chassis 202. Enclosure 200 also includes a base unit 208 that encloses a backplane PWB assembly (not shown). The backplane PWB provides an electrical connection between one or more sliding cards enclosed within chassis 202 and one or more connectors in connector section 206. FIG. 2 illustrates how external interconnections are positioned on the backplane PWB or PCB assembly of enclosure 200 on a separate section of enclosure 200 adjacent to chassis 202. This results in increased complexity in the design of the backplane PWB because horizontal wiring runs along the backplane PWB are needed to establish electronic connections between circuit card assemblies within chassis 202 and each external connector in connector section 206. Such a configuration results in a need for more complex test equipment or procedures for testing sliding cards. Because of this added complexity, system development, testing, and implementations are often delayed. Also, depending on the size or form-factor of a connector sliding card, only a limited quantity of external connectors may be supported.

Furthermore, any replacement or upgrade to the types of external connectors in connector section 206 would likely require more complex and more time-consuming servicing if at all possible without requiring full replacement of enclosure 200. In this case, chassis 202 houses one or more 6U sliding circuit card assemblies. Due to its configuration, enclosure 200 would likely not be able to receive other form-factor sliding cards such as 9U or 3U VPX cards. Furthermore, to provide EMI/RFI shielding, enclosure 200 uses a separate EMI/RFI shield plate 204 that is attached to the front of a chassis 202. This prevents external interconnects from being positioned on the front panel of a sliding card and results in the in a configuration where external connectors must be positioned in the external connector section 206 adjacent to chassis 202. As previously noted, such a configuration is more susceptible to environmental conditions or stresses such as vibrations or shock, at least because the backplane PWB must extend laterally beyond the chassis 202 to external connectors in connector section 206.

The overall size of enclosure 200 is typically based on fabrication limits on the length of a backplane PWB. For example, the backplane PWB length cannot exceed 36 inches. Such a limitation inhibits enclosure 200 from possibly holding larger form-factor circuit cards or multiple card having different form-factors. The need for positioning external connectors in connector section 206 also affects the layer count, electrical isolation, and thickness of external connectors. It also limits the plated through hole (pth) length to diameter (l/d) ratio to not exceed 10 to 1 for acceptable durability of external connectors. Such external connector requirements increase development times, increases complexity of sliding card testing, and increases development and maintenance costs.

Figure 3:
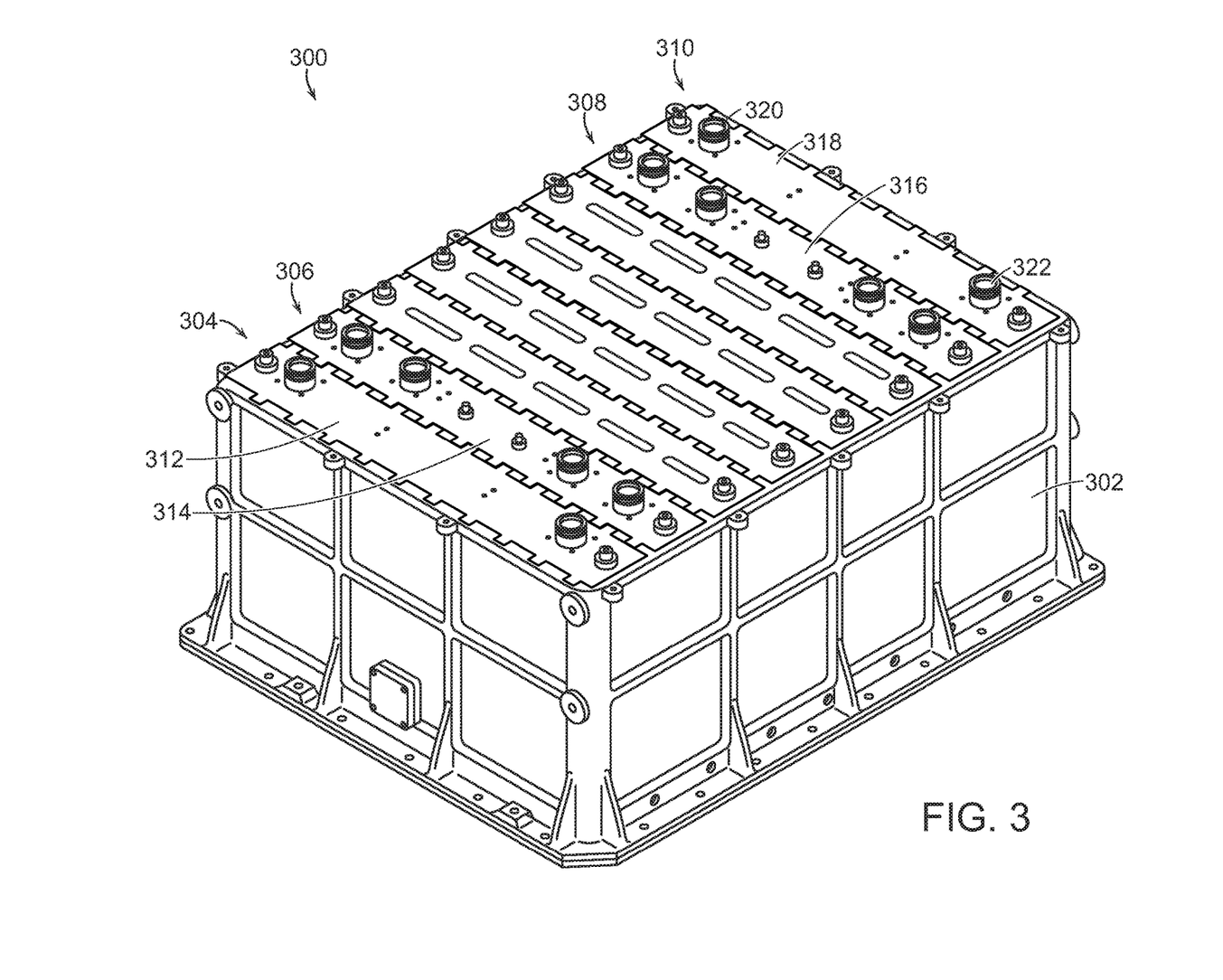
FIG. 3 shows an electronic enclosure including multiple individual slice front panels.

FIG. 3 shows an electronic enclosure 300 including a chassis 302 and multiple circuit card assemblies 304, 306, 308, and 310. Each of the circuit card assemblies includes a front panel 312, 314, 316, and 318 respectively. Each of the front panels includes one or more external input/output and/or interface connectors such as connectors 320 and 322 extending from front panel 318 of circuit card assembly 310. The chassis 302 and/or any of the front panels 312, 314, 316, and 318 may include EMI/RFI material to protect electronic components enclosed within enclosure 300 from electromagnetic interference and/or radio frequency interference. EMI/RFI material may include electrically conductive material such as, without limitation, steel, pre-tin plated steel, copper, copper alloy including nickel silver, and aluminum. Chassis 302 and/or any of the front panels 312, 314, 316, and 318 may include ionizing radiation shielding material such as, without limitation, lead, tungsten, graded-Z laminate, titanium, tantalum, tin, steel, copper, aluminum, polypropylene, and/or boron carbide, or any combination thereof.

Figure 4:
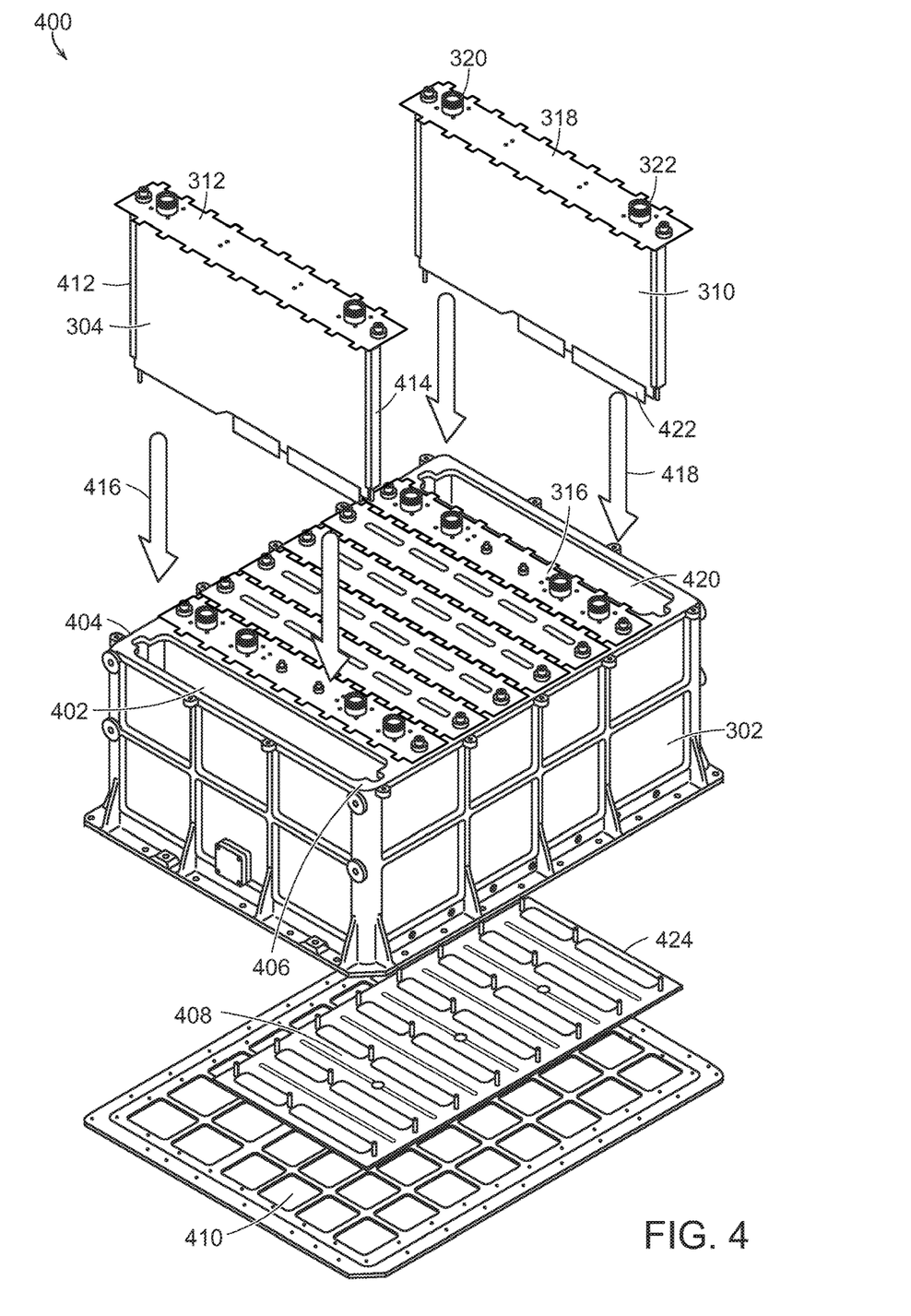
FIG. 4 shows an exploded view of the enclosure of FIG. 3 including various integrated and detachably connectable components.

FIG. 4 shows an exploded view 400 of enclosure 300 of FIG. 3 including various integrated and detachably connectable components. FIG. 4 illustrates how sliding circuit card assemblies 304 and 310 can be extended and/or inserted into circuit card assembly slots 402 and 420 respectively along directions denoted by directional arrows 416 and 418. Each circuit card assembly slot may include channels such as channels 404 and 406 of slot 402 that enable the sides of a printed circuit board or frame such sides 412 and 414 of circuit card assembly 312 to slide along the walls of channels 404 and 406 and, thereby, align circuit card assembly 312 in slot 402. This also aligns one or more circuit card assembly connectors of card assembly 312 with corresponding backend PWB connectors to enable physical and/or electrical engagement of the circuit card assembly connectors with corresponding backend PWB connectors. Exploded view 400 illustrates how sliding circuit card assemblies 304 and 310 can be detachably engaged via slots 402 and 420 with backplane PWB 408. For example, when circuit card assembly 310 is fully extended within slot 420, circuit card assembly 310 establishes a physical and/or electrical connection with backplane PWB 408 via connectors such as circuit card assembly connector 422 that aligns with and engages with backplane connector 424.

The chassis 302 cavity may be sealed on the bottom from EMI and RFI, and other environmental conditions, by a backside unit cover 410 that is positioned adjacent to and provides support for backplane PWB 408. The chassis 302 cavity may be sealed on the top from EMI and RFI, and other environmental conditions, by the panel covers such as panel covers 312 and 318 when their respective circuit card assemblies 304 and 310 are fully extended into slots 402 and 420 respectively. Each panel cover such as panels covers 318 and 316 may include a different number of and/or different types of external connects. As shown in FIG. 4, panel cover 318 includes two external circular connectors, while panel cover 316 includes six external connector of two different types and/or sizes.

FIGS. 3 and 4 illustrate an exemplary electronic enclosure 300 that includes a multi-functional slice front panel formed from an assembled combination and/or alignment of multiple front panels 312, 314, 316 and 318 when circuit card assemblies 304, 306, 308, and 310 are extended and/or inserted into slots, such as slots 402 and 420, of electronic chassis 302. The enclosure 300 is arranged, in certain aspects, to enable more efficient operation and maintenance of electronic systems housed within an electronic equipment enclosure 300. For example, by allowing an electronic chassis 302 to receive one or more multi-functional card assemblies 304, 306, 308, and 310 having multiple types of external interface connectors such as 320 and 322, an operator is able to efficiently remove a single circuit card assembly with a front panel, e.g., circuit card assembly 304 with front panel 312, while leaving other circuit card assemblies in place such as, circuit card assemblies 306 and 308. Circuit card assembly 304 may be removed and replaced with the same type of circuit card assembly to possibly repair an originally-defective circuit card 304 and its electronic circuits. Circuit card assembly 304 may be replaced with a circuit card assembly with a multi-functional slice front panel having a different set of external interface connectors such as, for example, a circuit card assembly having the same number and type of external interface connectors as circuit card assembly 316. Circuit card assembly 304 may be replaced with a circuit card assembly of a different type and/or form factor.

In certain implementations, electronic enclosure 300 has a modular capability where electronic chassis 302 is configured to receive multiple circuit card assemblies 304, 306, 308, and 310, such that each circuit card assembly includes a front panel 312, 314, 316, and 318 having various reconfigurable external connector configurations. This configuration implements a multi-functional front slice panel for electronic enclosure 300 and/or chassis 302. In other words, the various front panels 312, 314, 316, and 318 of the various circuit card assemblies 304, 306, 308, and 310 form an overall front slice panel when their respective circuit card assemblies are fully inserted into electronic chassis 302 such that the front panel slices 312, 314, 316, and 318 associated with the various circuit card assemblies 304, 306, 308, and 310 and the overall front panel are removable and/or interchangeable. Such a system is more adaptable, configurable, and maintainable than conventional electronic equipment enclosures such as enclosure 200 of FIG. 2.

The multi-functional front slice panel configuration of electronic enclosure 300 eliminates the need for an EMI/RF shield plate 202, as shown in FIG. 2, to cover one or all of the circuit card assemblies after the circuit card assemblies are installed in an electronic chassis. Instead, each circuit card assembly 304, 306, 308, and 310 may be assembled before installation in a chassis slot with a front panel 312, 314, 316, and 318 respectively, where each front panel 312, 314, 316, and 318 includes an EMI/RF shield and EMI/RF gasket configured to contact chassis 302 along a periphery of a circuit card assembly slot, such as slot 402 and 420. In this way, each circuit card assembly 304, 306, 308, and 310 and its front panel 312, 314, 316, and 318 form an EMI/RF shield when each circuit card assembly 304, 306, 308, and 310 is fully engaged and/or inserted within a slot of electronic chassis 302. This allows for individual replacement and/or upgrade of the electronics and/or connectors of an individual circuit card while not affecting operations or requiring reconfigurations of other circuit cards or electronic chassis 302.

The electronic enclosure 300 and/or electronic chassis 302 may advantageously receive circuit card assemblies of different form-factors or sizes, allowing for further adaptability of an electronic enclosure 300. The multi-functional front slice panel configuration of enclosure 300 also eliminates the need for positioning external connectors adjacent to the electronic chassis 302 that houses the circuit card assemblies 304, 306, 308, and 310. This advantageously reduces the complexity of the electronic enclosure 300, chassis 302, and chassis backplane PWB 408, and also reduces potential loading on sliding circuit card assemblies 304, 306, 308, and 310, enclosure 302, and connectors such as external interface connectors 320 and 322 and/or connectors 422 and 424. By eliminating the need for a separate external connector section 206 positioned adjacent to the electronic chassis 202, the electronic chassis 302 and/enclosure 300 advantageously provides a structure that is more resistant to environmental conditions or stresses such as vibrations and shocks. The configuration of enclosure 300 and it individual slice panels may enable external interconnects to be routed directly to applicable circuit card assemblies and, thereby, reduce complexity of the backplane PWB 408, minimize electrical route lengths by eliminating an external connector section 206, provide a scalable enclosure 300 capable of receiving multiple sliding circuit card assembly form-factors and/or sizes, provide a scalable front slice panel capable of supporting different connector types and quantities, and allow for individual slice panel and associated circuit card assembly removal.

There are numerous further advantages to the configuration of electronic enclosure 300 including: using a scalable design that allows for enclosures and/or units with different slice counts and sizes, i.e., different circuit card assemblies with front panels of different sizes and/or form factors; using a modular design to accommodate multiple types of external interface connections such as, without limitation, a radio frequency (Rf) connector, digital connector (Dc), D-sub or D-shaped connector, fiber optic connector, Amphenol connector, thermocouple connector, coaxial connector, barrel audio or power connector, pluggable connector, USB connector, DVI connector, HDMI connector, modular connector, LGH connector, photovoltaic connector, and rectangular connector; allowing for individual sliding card removal from the chassis 302 with minimal fastener removal, i.e., using wedge lock fasteners; supporting various connector standards such as 3U, 6U, and 9U VPX connector sliding circuit card assembly configurations; taking into account Design for manufacturing, assembly, and test (DFMAT); providing a common stop-to for backplane connector interfaces such as VPX backplane connectors; utilizing different EMI/RFI gaskets; acting as a shear plate to support vibrational and shock environments; providing ionizing radiation shielding; and enabling variations in thickness and materials depending on expected environmental conditions such as radiation, vibration, and shock.

Figure 5A:
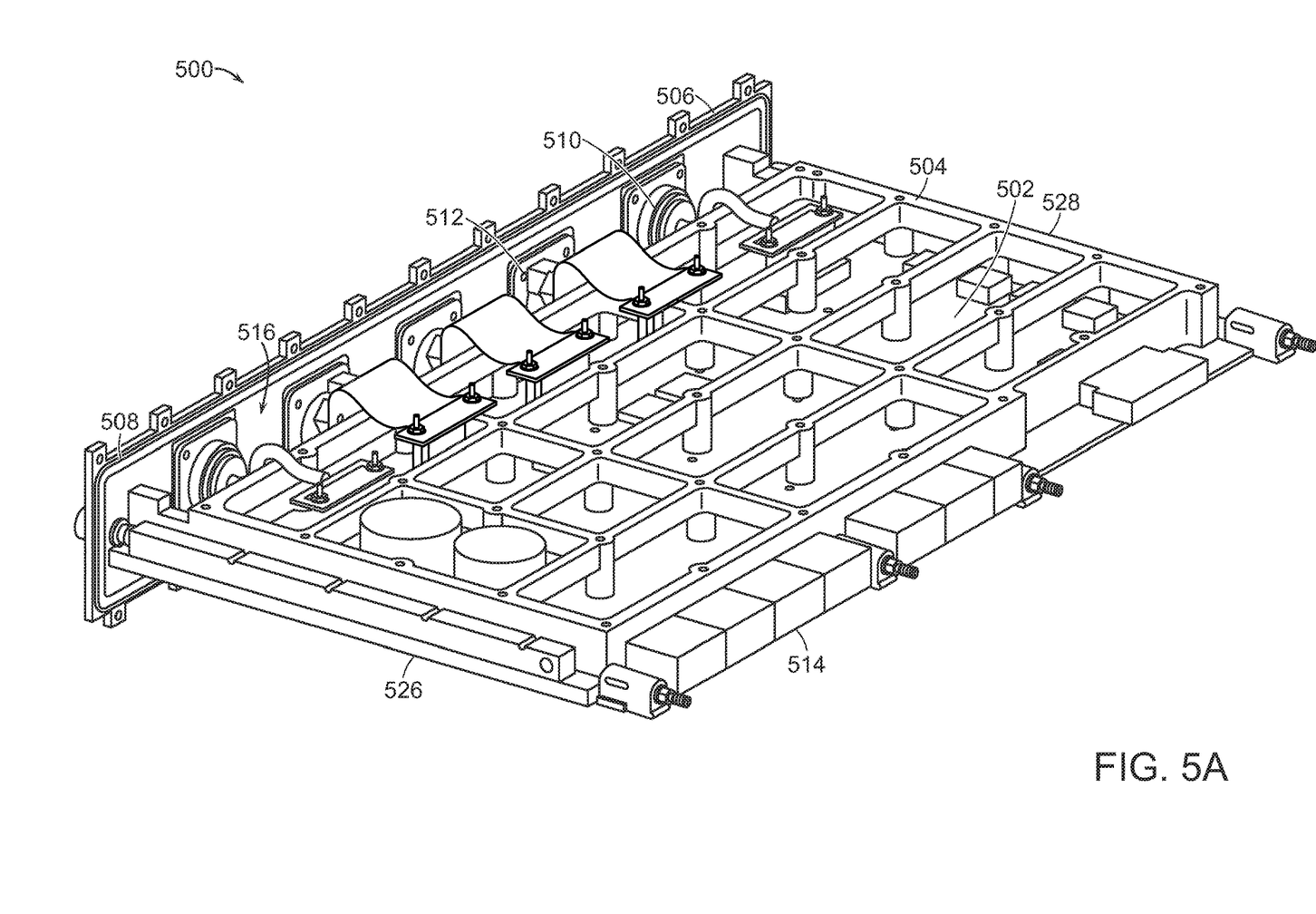
FIG. 5A shows back view of a sliding card assembly.

FIG. 5A shows a back view of a sliding circuit card assembly 500 similar to any of circuit card assemblies 304, 306, 308, and 310. Circuit card assembly 500 includes PCB 502, frame 504, front panel 506 including EMI/RFI gasket 508, external interface connectors 512 and 510 among other connectors, and circuit card assembly connectors including connector 514 that is arranged to engage a connector on backplane PWB 408 such as connector 424. PCB 502 may include one or more electronic circuits 524. Front panel 506 may be permanently or semi-permanently connected to PCB 502, frame 504, or both PCB 502 and frame 504. In some implementations, front panel 506 is connected to PCB 502 and/or frame 504 prior to circuit card assembly 500 being extended into and/or inserted into a slot of, for example, chassis 302.

Permanently connected or assembled means that components have been connected in a manner that would result in damage to at least one of the components when disconnected or disassembled, or would require modification of at least one of the components when the components are disconnected or disassembled. For example, if two components are glued together using permanent glue, the components may not be separated without damaging at least one of the components or at least one of the components may have to be cut away from the other component, resulting in a modification of the structure of at least one of the components. Semi-permanently connected means that components have been connected in a manner such that the components are not readily detachably connectable to each other. For example, where disconnection requires removal of one or more fasteners, e.g., screws, that are not configured for the purpose of enabling an operator to connect or disconnect the components during operation of a system in which the components are installed.

Front panel 506 may including multiple external interface and/or input/output connections, each of the same or different type. Front panel 506 may include one or more RFI/EMI gaskets such as gasket 508. Additional gaskets may be inserted, for example, between an external connector assembly and the back surface or side 516 of front panel 506. Frame 504 may include a rigid material to provide structural support for PCB 502, front panel 506, and/or circuit card assembly 500. Frame 504 material may include, without limitation, polystyrene, polycarbonate, and/or a metal such as aluminum. Frame 504 may be mounted on one side of PCB 502 as illustrated in FIG. 5A. or may be mounted on both sides of PCB 502. Frame 504 may include a first side 526 and second side 528 that correspond with and/or are adjacent to first and second sides of PCB 502. Circuit card connectors such as connector 514 may include a VPX connector arranged to engage a backplane VPX connector such as connector 424 mounted on backplane PWB 408. As previously noted, front panel 506 may include EMI/RFI shielding material to protect electronic circuits mounted on PCB 502 from electromagnetic and radio frequency interference. Front panel 506 may alternatively or additionally include ionizing radiation shielding.

Figure 5B:
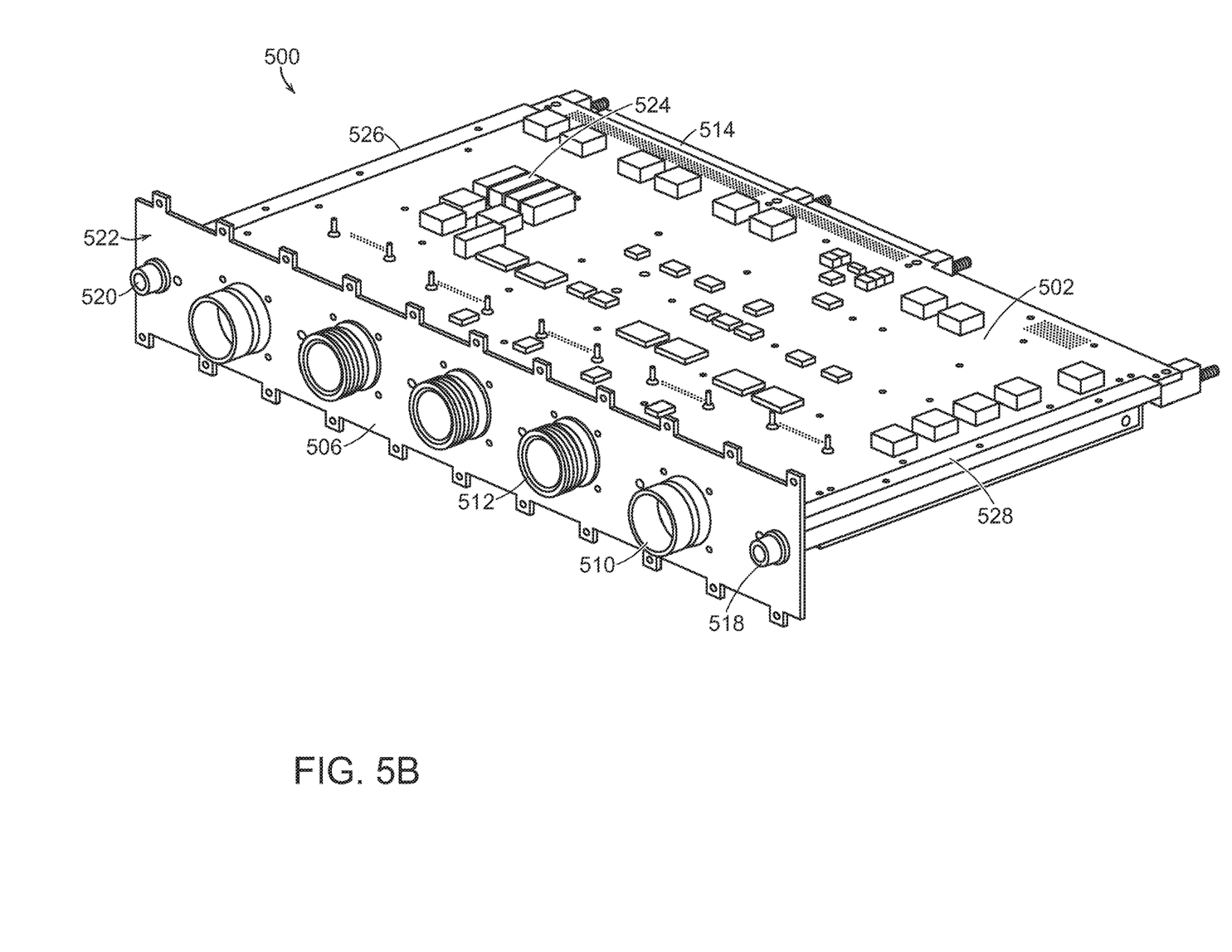
FIG. 5B shows a front view of the sliding card assembly of FIG. 5A which contains an EMI/RFI gasket.

FIG. 5B shows a front view of sliding card assembly 500 of FIG. 5A. FIG. 5B shows the front surface 522 of front panel 506 with multiple external interface connectors such as connector 510 and 512 extending away from the front surface or side 522 and PCB 502. As previously noted, external input/output or interface connectors may be of different types such as connectors 510 and 512. Circuit card assembly 500 may include wedge lock fasteners 518 and 520 to enable an operator to readily inert and/or remove circuit card assembly 500 from a slot of an electronic chassis such as chassis 302.

Figure 6:
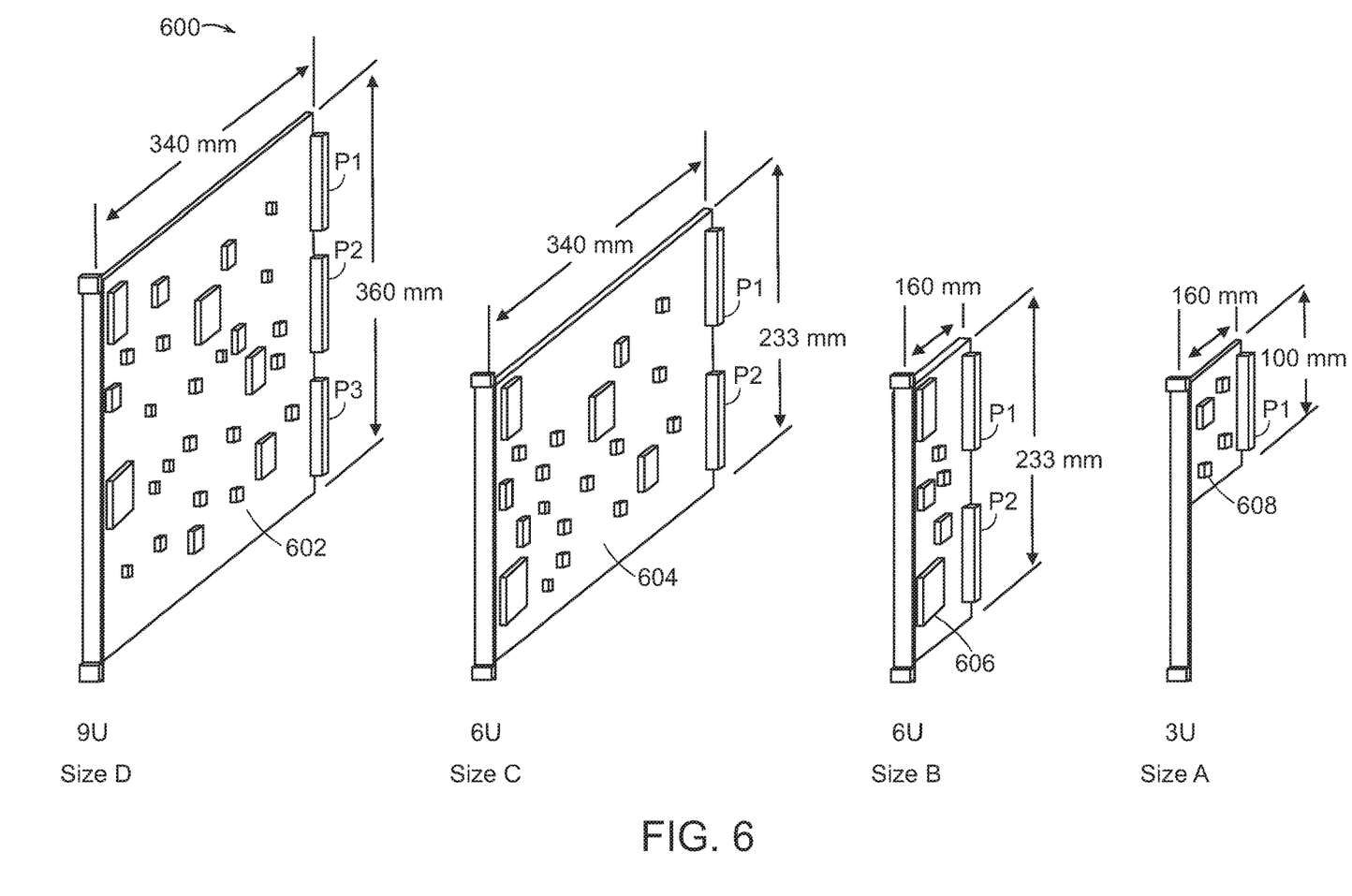
FIG. 6 provides a comparative view of various types of sliding card assemblies and their relative sizes.

FIG. 6 provides a comparative view 600 of various types of sliding card assemblies and their relative sizes that may be inserted and/or extended into chassis 302. A chassis such as chassis 302 may support receiving circuit card assemblies of various form factors such as, without limitation, circuit card assemblies 602, 604, 606, and 608. Circuit card assembly 602 may include a 9U (size D) format, while circuit card assembly 604 may include a 6U (size C) format, circuit card assembly 606 may include a 6U (size B) format and circuit card assembly 608 includes a 3U (size A) format.

VPX, formally known as VITA 46, is an ANSI standard (ANSI/VITA 46.0-2007) that provides VMEbus-based systems with support for switched fabrics over a high speed connector. Defined by the VITA (VME International Trade Association) working group, it has been designed specifically with defense applications in mind, having an enhanced module standard that enables applications and platforms with superior performance. VPX retains VME's existing 6U and 3U Eurocard form factors, supporting existing PCI Mezzanine Card (PMC) and XMC mezzanines (i.e., PMC with high-speed serial fabric interconnect), and maintaining the maximum possible compatibility with VMEbus. A circuit card assembly and/or chassis may be configured to meet a technology readiness level (TRL) criteria including levels 1 through 9.

Figure 7:
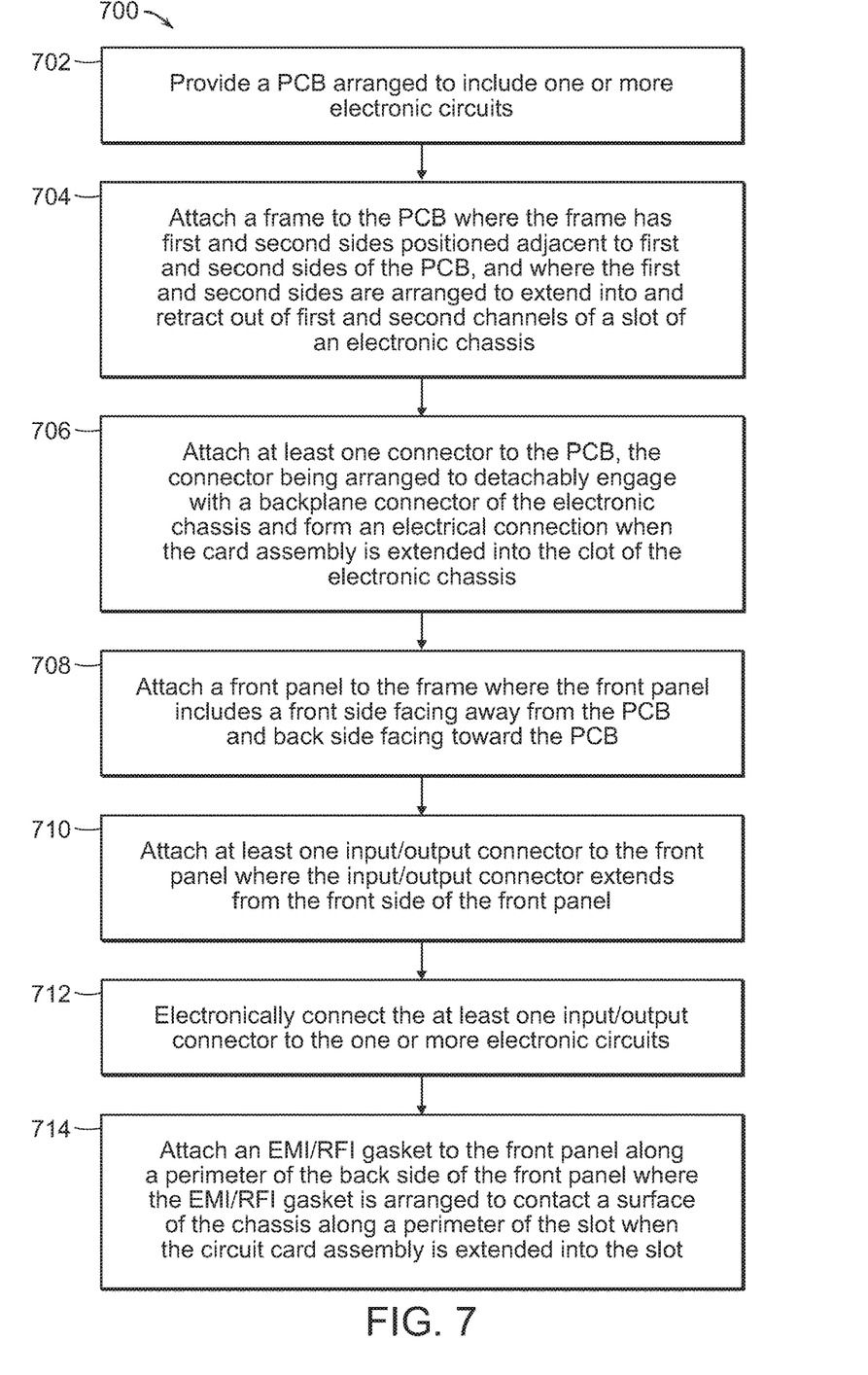
FIG. 7 is process of manufacturing of sliding card assembly.

FIG. 7 is process 700 for manufacturing a sliding card assembly such as sliding circuit card assembly 500. The process 700 includes: providing a printed circuit board 502 that is arranged to include one or more electronic circuits 524 (Step 702); attaching a frame 504 to the printed circuit board 502, where the frame 504 includes first and second sides 526 and 528 that are positioned adjacent to first and second sides of printed circuit board 502, and where the first and second sides 526 and 528 of the frame 504 are arranged to extend into and retract out of first and second channels, such as channels 404 and 406, of a circuit card assembly slot 402 of an electronic chassis 302 (Step 704); and attaching at least one connector 512 to the printed circuit board 502 such that the at one connector 514 is arranged to detachably engage with, for example, a backplane connector 424 of electronic chassis 302 when the circuit card assembly 500 is extended into the circuit card assembly slot 420 of electronic chassis 302. The connector 514 and/or 422 may be configured to establish an electrical connection with a backplane printed wiring board (PWB) 408 of electronic chassis 302 while engaged with backplane connector 424 (Step 706).

The process 700 further includes: attaching a front panel 506 to frame 504, where front panel 506 includes a front side 522 facing away from printed circuit board 502 and a back side 516 facing toward printed circuit board 502 (Step 708); attaching at least one input/output connector 510 and/or 512 to front panel 506, where the at least one input/output connector 510 and/or 512 extends from the front side 522 of the front panel 506 (Step 710); electrically connecting the at least one input/output connector 510 and/or 512 to the one or more electronic circuits 524 (Step 712); and attaching an EMI/RFI gasket 508 to front panel 506 along a perimeter of the back side of the front panel, where the EMI/RFI gasket 508 is arranged to contact a surface of electronic chassis 302 along a perimeter of, for example, circuit card assembly slot

420 when the circuit card assembly 500 or 310 is extended into the circuit card assembly slot 420 (Step 714).

In some implementations, the front panel 506 is permanently or semi-permanently connected to the frame 504 and/or printed circuit board 502. The front panel 506 may be connected to the frame 504 and/or printed circuit board 502 before being extended into a circuit card assembly slot such as slot 420. The front panel 506 may be integrated or integrally formed with frame 504.

Elements or steps of different implementations described may be combined to form other implementations not specifically set forth previously. Elements or steps may be left out of the systems or processes described previously without adversely affecting their operation or the operation of the system in general. Furthermore, various separate elements or steps may be combined into one or more individual elements or steps to perform the functions described in this specification.

Other implementations not specifically described in this specification are also within the scope of the following claims.

What is claimed is:

1. A circuit card assembly comprising:
   a printed circuit board arranged to include one or more electronic circuits;
   a frame connected to the printed circuit board, the frame including first and second sides positioned adjacent to first and second sides of the printed circuit board, the first and second sides of the frame arranged to extend into and retract out of first and second channels of a circuit card assembly slot of an electronic chassis;
   at least one connector arranged to detachably engage with a backplane connector of the electronic chassis when the circuit card assembly is extended into the circuit card assembly slot of the electronic chassis, the connector establishing an electrical connection with a backplane printed wiring board (PWB) of the electronic chassis while engaged with the backplane connector; and
   a front panel extending from the first side to the second side of the frame, the front panel including a front side facing away from the printed circuit board and a back side facing toward the printed circuit board, the front panel including at least one input/output connector extending from the front side of the front panel, the at least one input/output connector being in electrical communication with the one or more electronic circuits, the front panel including an EMI/RFI gasket positioned along a perimeter of the back side of the front panel, the EMI/RFI gasket arranged to contact a surface of the electronic chassis along a perimeter of the circuit card assembly slot when the circuit card assembly is extended into the circuit card assembly slot.

2. The circuit card assembly of claim 1, wherein the front panel is one of permanently and semi-permanently connected to at least one of the frame and printed circuit board.

3. The circuit card assembly of claim 1, wherein the front panel is connected to the at least one of the frame and the printed circuit board before being extended into the circuit card assembly slot.

4. The circuit card assembly of claim 1, wherein the front panel is integrated with the frame.

5. The circuit card assembly of claim 1, wherein the front panel includes a plurality of input/output connectors.

6. The circuit card assembly of claim 5, wherein the plurality of input/output connectors include at least two different types of connectors.

7. The circuit card assembly of claim 6, wherein the type of connector includes one of a radio frequency (Rf) connector, D-sub or D-shaped connector, fiber optic connector, Amphenol connector, Thermocouple connector, coaxial connector, barrel audio or power connector, pluggable connector, USB connector, DVI connector, HDMI connector, modular connector, LGH connector, photovoltaic connector, and rectangular connector.

8. The circuit card assembly of claim 1, wherein the front panel includes an EMI/RFI shield.

9. The circuit card assembly of claim 8, wherein the EMI/RFI shield includes electrically conductive material.

10. The circuit card assembly of claim 1, wherein the front panel includes a plurality of EMI/RFI gaskets.

11. The circuit card assembly of claim 1, wherein the front panel provides an ionizing radiation shield.

12. The circuit card assembly of claim 1, wherein the frame is configured to provide structural support to the printed circuit board.

13. The circuit card assembly of claim 1 comprising at least one fastener being accessible via the front panel and arranged to fasten the circuit card assembly to the electronic chassis.

14. The circuit card assembly of claim 13, wherein the at least one fastener includes one of a wedge lock fastener and threaded fastener.

15. An electronic enclosure comprising:
    a chassis having a plurality of circuit card assembly slots including a first circuit card assembly slot arranged to receive a first circuit card assembly, the first circuit card assembly slot including a peripheral surface arranged to contact an EMI/RFI gasket of the first circuit card assembly when the circuit card assembly is extended into the first circuit card assembly slot, wherein the first circuit card assembly slot is configured to receive a circuit card assembly having: i) a printed circuit board arranged to include one or more electronic circuits, ii) a frame connected to the printed circuit board, iii) at least one connector in electrical communication with the one or more electronic circuits, and iv) a front panel including a front side facing away from the printed circuit board and a back side facing toward the printed circuit board, the front panel including at least one input/output connector extending from the front side of the front panel and including an EMI/RFI gasket positioned along a perimeter of the back side of the front panel; and
    a backplane printed wiring board, connected to the chassis, including a plurality of backplane connectors aligned with the plurality of circuit card assembly slots, the plurality of backplane connectors including a first backplane connector aligned with the first circuit card assembly slot, the first backplane connector arranged to detachably engage with the at least one connector of the first circuit card assembly when the first circuit card assembly is extended into the first circuit card assembly slot, the first back plane connector establishing an electrical connection with first circuit card assembly while engaged with the at least one connector of the first circuit card assembly.

16. The electronic enclosure of claim 15, wherein the chassis includes an EMI/RFI shield.

17. The electronic enclosure of claim 15 comprising a backside cover positioned adjacent to the backplane printed wiring board and connected with the chassis.

18. The electronic enclosure of claim 15, wherein the plurality of circuit card assembly slots are configured to receive circuit card assemblies having different form factors.

19. The electronic enclosure of claim 18, wherein the form factor includes one of 9U, 6U, and 3U form factors.

20. A method of manufacturing a circuit card assembly comprising:

providing a printed circuit board arranged to include one or more electronic circuits;

attaching a frame to the printed circuit board, the frame including first and second sides positioned adjacent to first and second sides of the printed circuit board, the first and second sides of the frame arranged to extend into and retract out of first and second channels of a circuit card assembly slot of an electronic chassis;

attaching at least one connector to the printed circuit board, the at one connector being arranged to detachably engage with a backplane connector of the electronic chassis when the circuit card assembly is extended into the circuit card assembly slot of the electronic chassis, the connector configured to establish an electrical connection with a backplane printed wiring board (PWB) of the electronic chassis while engaged with the backplane connector; and attaching a front panel to the frame, the front panel including a front side facing away from the printed circuit board and a back side facing toward the printed circuit board;

attaching at least one input/output connector to the front panel, where the at least one input/output connector extends from the front side of the front panel;

electrically connecting the at least one input/output connector to the one or more electronic circuits; and attaching an EMI/RFI gasket to the front panel along a perimeter of the back side of the front panel, the EMI/RFI gasket arranged to contact a surface of the electronic chassis along a perimeter of the circuit card assembly slot when the circuit card assembly is extended into the circuit card assembly slot.

\* \* \* \* \*